(12) United States Patent
Sun et al.

(10) Patent No.: US 10,790,183 B2
(45) Date of Patent: Sep. 29, 2020

(54) SELECTIVE OXIDATION FOR 3D DEVICE ISOLATION

(71) Applicant: Applied Materials, Inc., Santa Clara, CA (US)

(72) Inventors: Shiyu Sun, Santa Clara, CA (US); Keith Tatseun Wong, Los Gatos, CA (US); Kurtis Leschkies, San Jose, CA (US); Namsung Kim, Sunnyvale, CA (US); Srinivas Nemani, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/407,510

(22) Filed: May 9, 2019

(65) Prior Publication Data
US 2019/0371650 A1 Dec. 5, 2019

Related U.S. Application Data

(60) Provisional application No. 62/680,857, filed on Jun. 5, 2018.

(51) Int. Cl.
| | |
|---|---|
| *H01L 21/762* | (2006.01) |
| *H01L 21/02* | (2006.01) |
| *H01L 21/324* | (2006.01) |
| *H01L 29/78* | (2006.01) |
| *H01L 29/66* | (2006.01) |

(Continued)

(52) U.S. Cl.
CPC .... *H01L 21/76202* (2013.01); *H01L 21/0245* (2013.01); *H01L 21/02381* (2013.01); *H01L 21/02507* (2013.01); *H01L 21/30604* (2013.01); *H01L 21/324* (2013.01); *H01L 29/0649* (2013.01); *H01L 29/66545* (2013.01); *H01L 29/66795* (2013.01); *H01L 29/785* (2013.01)

(58) Field of Classification Search
CPC ......... H01L 21/02507; H01L 21/02381; H01L 21/0245
See application file for complete search history.

(56) References Cited

U.S. PATENT DOCUMENTS

| | | |
|---|---|---|
| 4,409,260 A | 10/1983 | Pastor et al. |
| 9,423,313 B2 | 8/2016 | Douba et al. |
| 9,741,626 B1 | 8/2017 | Cheng et al. |

(Continued)

FOREIGN PATENT DOCUMENTS

KR 101438291 B1 9/2014

OTHER PUBLICATIONS

International Search Report and Written Opinion for International Application No. PCT/US2019/032609 dated Sep. 11, 2019.

*Primary Examiner* — Jay C Chang
*Assistant Examiner* — Mikka Liu
(74) *Attorney, Agent, or Firm* — Patterson + Sheridan, LLP

(57) ABSTRACT

Embodiments described herein generally relate to methods and device structures for horizontal gate all around (hGAA) isolation and fin field effect transistor (FinFET) isolation. A superlattice structure comprising different materials arranged in an alternatingly stacked formation may be formed on a substrate. In one embodiment, at least one of the layers of the superlattice structure is oxidized by a high pressure oxidation process to form a buried oxide layer adjacent the substrate.

20 Claims, 6 Drawing Sheets

(51) Int. Cl.
   *H01L 21/306*       (2006.01)
   *H01L 29/06*        (2006.01)

(56)            References Cited

U.S. PATENT DOCUMENTS

| | | |
|---|---|---|
| 2002/0197806 A1 | 12/2002 | Furukawa et al. |
| 2006/0110934 A1 | 5/2006 | Fukuchi |
| 2008/0073691 A1 | 3/2008 | Konno et al. |
| 2009/0035952 A1 | 2/2009 | Chua et al. |
| 2010/0297854 A1 | 11/2010 | Ramamurthy et al. |
| 2013/0277760 A1 | 10/2013 | Lu et al. |
| 2014/0034632 A1 | 2/2014 | Pan et al. |
| 2014/0319462 A1 | 10/2014 | Huang et al. |
| 2015/0144999 A1 | 5/2015 | Ching et al. |
| 2015/0145002 A1 | 5/2015 | Lee et al. |
| 2015/0270348 A1 | 9/2015 | Basker et al. |
| 2016/0093726 A1 | 3/2016 | Ching et al. |
| 2016/0111337 A1 | 4/2016 | Hatcher et al. |
| 2016/0181414 A1 | 6/2016 | Huang et al. |
| 2016/0308048 A1 | 10/2016 | Ching et al. |
| 2016/0336405 A1* | 11/2016 | Sun .................. H01L 29/78642 |
| 2017/0301767 A1 | 10/2017 | Niimi et al. |
| 2017/0317109 A1 | 11/2017 | Wang et al. |
| 2018/0033615 A1 | 2/2018 | Tjandra |

* cited by examiner

SELECTIVE OXIDATION FOR 3D DEVICE ISOLATION

CROSS-REFERENCE TO RELATED APPLICATIONS

This application claims benefit of U.S. Provisional Patent Application No. 62/680,857, filed Jun. 5, 2018, the entirety of which is herein incorporated by reference.

BACKGROUND

Field

Embodiments of the present disclosure generally relate to selective oxidation processes for horizontal gate all around (hGAA) device structures and fin field effect transistor (FinFET) device structures.

Description of the Related Art

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (FinFET) structure, and a horizontal gate-all-around (hGAA) structure. The hGAA device structure includes several lattice matched channels suspended in a stacked configuration and connected by source/drain regions.

However, challenges associated with hGAA structures include the existence of a parasitic device at the bottom of the stacked lattice matched channels. FinFET structures, which may exhibit different architectures from hGAA structures, also suffer from parasitic leakage and capacitance. Conventional approaches to mitigate the effects of the parasitic device include the implantation of dopants into the parasitic device to suppress leakage of the device. However, a dosage of the dopants utilized to suppress the leakage may hinder epitaxial growth of device structures on the parasitic device. The dopants may deleteriously diffuse into channels of the device structures during subsequent processing operations, which may result an undesirable increase in device variability. In addition, implantation may not adequately reduce parasitic capacitance. Another conventional approach utilizes thermal oxidation of a highly doped parasitic device. However, thermal oxidation processes generally utilize temperatures beyond the thermal budgets of the stacked lattice matched channels and conventional oxidation processes do not provide sufficient oxidation selectivity for the materials of hGAA and FinFET device structures.

Accordingly, what is needed in the art are improved methods for forming FinFET and hGAA device structures.

SUMMARY

In one embodiment, a semiconductor process method is provided. The method includes forming a superlattice structure on a substrate. The superlattice structure includes a first material layer, a second material layer, and a third material layer. The method further includes patterning the superlattice structure, etching the superlattice structure, and performing an oxidation process to oxidize at least one of the first material layer, the second material layer, or the third material layer to form a buried oxide layer and the oxidation process is performed at a pressure of greater than about 30 bar.

In another embodiment, a semiconductor process method is provided. The method includes forming a superlattice structure on a substrate. The superlattice structure includes a first material layer, a second material layer, and a third material layer. The method further includes patterning the superlattice structure, etching the superlattice structure, and performing a shallow trench isolation process to deposit an oxide material layer on the substrate. A shallow trench isolation recess process is performed and an oxidation process is performed after the shallow trench isolation recess process to oxidize at least one of the first material layer, the second material layer, or the third material layer to form a buried oxide layer and the oxidation process is performed at a pressure of greater than about 30 bar.

In yet another embodiment, a semiconductor process method is provided. The method includes forming a superlattice structure on a substrate. The superlattice structure includes a first material layer, a second material layer, and a third material layer. A dummy gate structure is formed on the substrate, source/drain regions are formed on the substrate, the dummy gate structure is removed, and an oxidation process is performed after removing the dummy gate structure. The oxidation process oxidizes at least one of the first material layer, the second material layer, or the third material layer to form a buried oxide layer. The oxidation process is performed at a pressure of greater than about 30 bar and a replacement metal gate structure is formed on the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to methods and device structures for horizontal gate all around (hGAA) isolation and fin field effect transistor (FinFET) isolation. A superlattice structure comprising different materials arranged in an alternatingly stacked formation may be formed on a substrate. In one embodiment, at least one of the layers of the superlattice structure are oxidized to form a buried oxide layer adjacent the substrate.

In one example, the superlattice structure includes one or more silicon containing material layers and one or more silicon germanium (SiGe) containing material layers disposed in an alternating stacked arrangement. At least one of the SiGe layers has a higher germanium content when compared to other SiGe layers in the superlattice structure. The higher germanium content SiGe layer is oxidized to form a buried oxide layer to provide for improved device isolation in an hGAA or FinFET architecture. As a result, a substantially defect free stacked channel structure which can provide a geometric benefit in the current density per square micrometer of surface area on a substrate may be achieved. Accordingly, circuit density may be increased, parasitic leakage and capacitance may be reduced, and power consumption of the device may be reduced.

Figure 1:
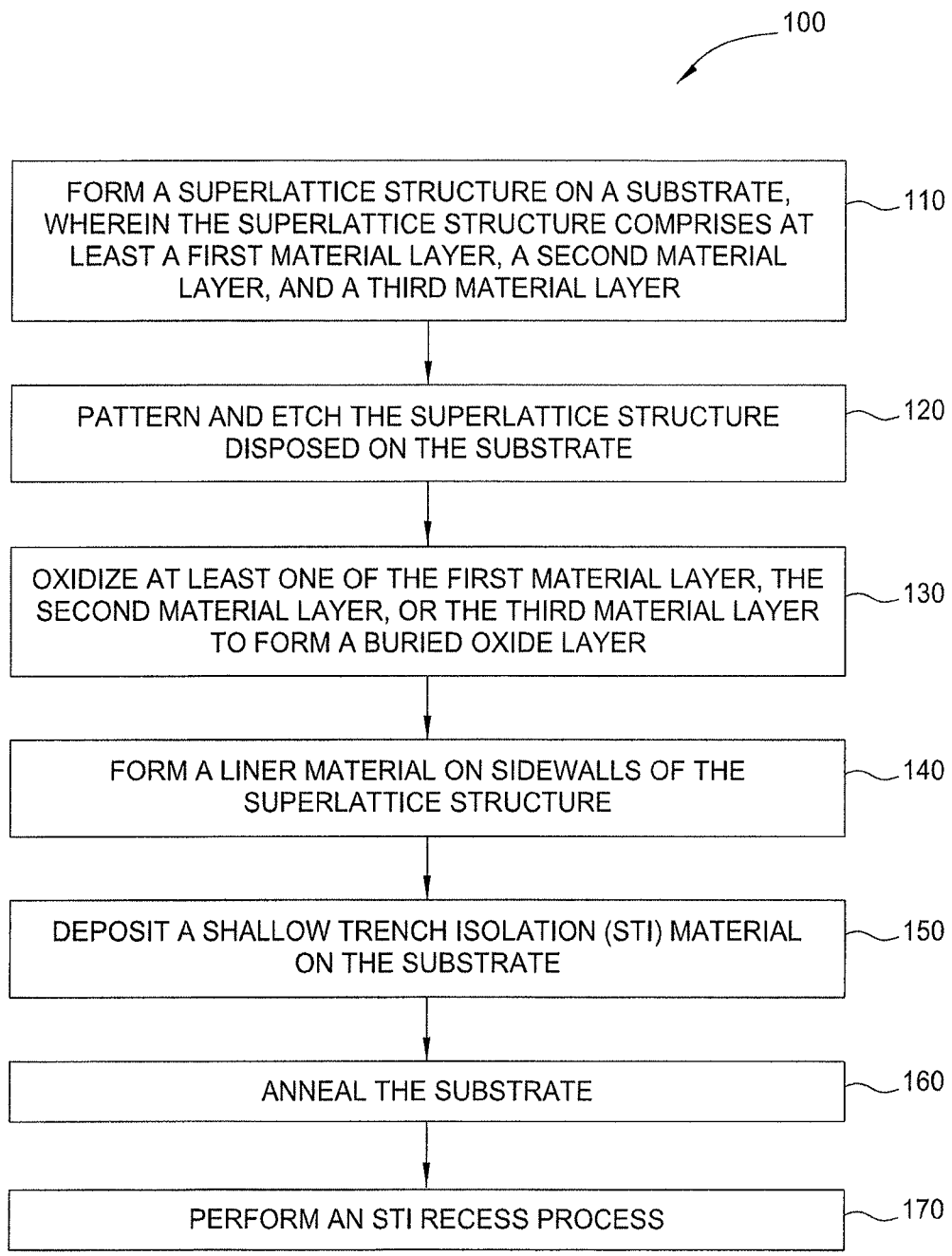
FIG. 1 illustrates operations of a method for forming a buried oxide material in a device structure.

FIG. 1 illustrates operations of a method 100 for forming a buried oxide material in an hGAA or FinFET structure. The method 100 may be part of a multi-operation fabrication process of a semiconductor device, for example, an hGAA or FinFET device. At operation 110, a superlattice structure is formed on a substrate. The term superlattice, as utilized herein, generally refers to a stack of material layers which are closely lattice matched materials, but are sufficiently different in composition that selective removal processes can be performed on the superlattice structure. More generally, the composition of various material layers in the stack may be unique to one or more of the materials layers in the stack.

In one example, the superlattice structure includes one or more layers of a silicon containing material and a silicon germanium containing material. In one embodiment, the superlattice structure includes a first material layer and a second material layer. In another embodiment, the superlattice structure includes a first material layer, a second material layer, and a third material layer. In this embodiment, the second material layer and the third material layer are formed from the same compound material, but may have different material properties.

At operation 120, the superlattice structure is patterned and etched. The patterning process, such as a photolithography process or other similar patterning process, creates a pattern on the superlattice structure. After patterning, the patterned superlattice structure is etched, for example, by a reactive ion etching process or other plasma based etching process.

At operation 130, at least one of the first material layer, the second material layer, or the third material layer is oxidized to form a buried oxide (BOX) layer. In one example, the second material layer and the third material layer are oxidized. In another example, the third material layer is oxidized. In one embodiment, the oxidation process is performed after the patterning and etching of the superlattice structure.

In one embodiment, the oxidation process is a high pressure oxidation process. In this embodiment, the superlattice structure is exposed to one or more precursors, such as $H_2O$, $O_2$, $O_3$, $H_2O_2$ or combinations thereof, at a pressure of greater than about 10 bar, such as greater than about 30 bar, for example, about 55 bar. In this embodiment, a temperature of the high pressure oxidation process is less than about 500° C., such as between about 300° C. and about 400° C., for example, between about 325° C. and about 375° C. In one embodiment, the temperature is about 355° C.

In one embodiment, the high pressure oxidation process utilizes steam at a pressure of about 55 bar and a temperature of about 355° C. to selectively oxidize germanium containing films preferentially to silicon containing films of the superlattice structure. Utilizing the high pressure oxidation process enables oxidation selectivity between SiGe and Si of greater than about 5:1, such as about 10:1. Thus, the SiGe is oxidized at a rate of between about 5 times and about 10 times greater than an oxidation rate of the Si. By utilizing temperatures of less than about 500° C., selective oxidation may be performed without exceeding thermal budgets of the device structures. In one example, the steam utilized during the high pressure oxidation process is dry steam. In another example, the dry steam may be superheated dry steam.

The high pressure utilized in the embodiments described herein is believed to provide sufficient activation energy to drive the oxidation at a commercially viable rate. In one embodiment, the oxidation process is performed for a duration of between about 5 minutes and about 30 minutes, such as between about 10 minutes and about 20 minutes. Thus, throughput is increased by utilizing the high pressure oxidation process when compared to conventional oxidation processes, many of which take several hours or more to sufficiently oxidize desired device structures.

At operation 140, a liner material is optionally formed on sidewalls of the superlattice structure. In one embodiment, the liner material is deposited, for example, by a chemical vapor deposition, an atomic layer deposition, or epitaxial deposition process. In another embodiment, the liner material is formed (i.e. grown) by suitable processes, such as thermal oxidation or thermal nitridation processes. The liner material is generally configured to repair portions of the superlattice structure which may be damaged during previous etching processes.

In one embodiment, the liner material is an oxide material, a nitride material, or an oxynitride material. For example, the liner material may be a $SiO_2$ material, a SiN material, or a SiON material. In other embodiments, the liner material contains carbon and/or boron. For example, the liner material may be a SiCN material, a SiOCN material, a SiBN material, a SiOBN material, and/or a SiOBCN material. In another embodiment, the liner material is a phosphosilicate glass (PSG), a borosilicate glass (BSG), or doped glass material. It is contemplated that the various aforementioned liner materials may be doped in certain embodiments.

At operation 150, a shallow trench isolation (STI) material is deposited on the substrate. In one embodiment, the STI material is an oxide material, such as $SiO_2$ or the like. Generally, the oxide material is formed over and around the superlattice structure. In one embodiment, the oxide material is deposited by a flowable chemical vapor deposition (CVD) process.

At operation 160, an annealing process is performed on the substrate. In one embodiment, the annealing process includes a steam annealing process, such as a wet steam anneal. In another embodiment, the annealing process includes a steam annealing process and a dry annealing process. In yet another embodiment, the annealing process includes a dry annealing process (i.e. no steam). Generally, the annealing process provides for improved densification of the STI material which may improve isolation of features formed on the substrate.

In one embodiment, operation 160 is replaced by the high pressure oxidation process. In this embodiment, operation 130 is not performed and the operation 160 is replaced by operation 130 after performing operation 150.

At operation 170, an STI recess process is performed. Generally, the STI material is etched to expose a portion of the superlattice. In one embodiment, the STI material is recessed such that the STI material is co-planar with the BOX layer. STI planarization may also be performed prior to the STI recess process. A more detailed description of the method 100 is provided in the description of FIGS. 2-7, which illustrate various stages of fabrication of a semiconductor device.

Figure 2:
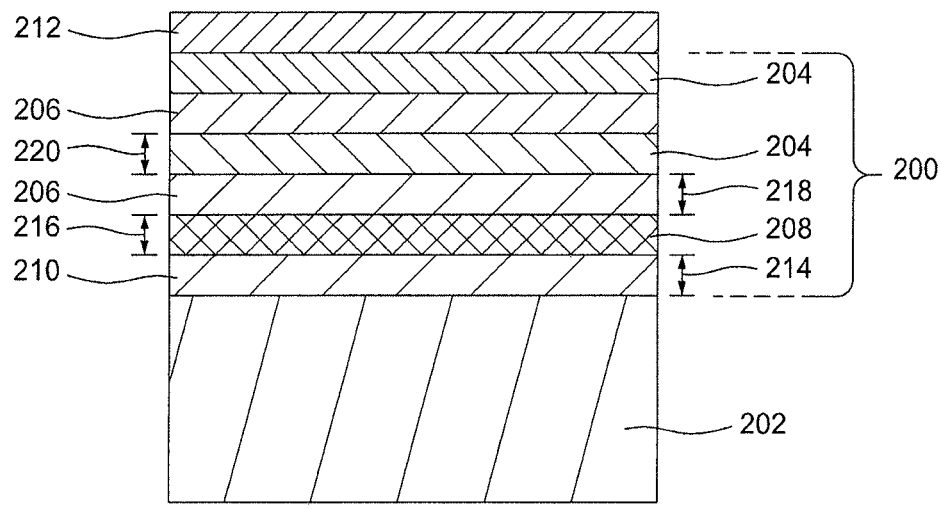
FIG. 2 illustrates a schematic, cross-sectional view of a portion of a substrate having a superlattice structure formed thereon.

FIG. 2 illustrates a schematic, cross-sectional view of a portion of a substrate 202 having a superlattice structure 200 formed thereon. In one embodiment, the substrate 202 is a bulk semiconductor substrate. The term bulk semiconductor substrate refers to a substrate in which the entirety of the substrate is comprised of a semiconductor material. The bulk semiconductor substrate includes any suitable semiconducting material and/or combinations of semiconducting materials for forming a semiconductor structure. For example, the semiconducting layer includes one or more materials such as crystalline silicon (e.g., Si<100> or Si<111>), silicon oxide, strained silicon, silicon germanium, doped or undoped polysilicon, doped or undoped silicon substrates, patterned or non-patterned substrates, doped silicon, germanium, gallium arsenide, or other suitable semiconducting materials. In one embodiments, the semiconductor material is silicon. In other embodiments, the semiconductor material is a doped material, such as n-doped silicon (n-Si), or p-doped silicon (p-Si).

The superlattice structure 200 includes a plurality of first layers 204 and a corresponding plurality of second layers 206 alternatingly arranged in a plurality of stacked pairs. In one embodiment, the plurality of first layers 204 are formed from a silicon containing material. In one embodiment, the plurality of second layers 206 are formed from at least a silicon containing material and a germanium containing material. Accordingly, the first layers 204 and the second layers 206 are different materials. In some embodiments, the plurality of first layers 204 and corresponding plurality of second layers 206 are lattice matched materials with a sufficient difference in composition such that selective layer removal or selective oxidation can subsequently be performed.

In certain embodiments, the plurality of first layers 204 include Group IV materials, such as silicon. The plurality of second layers 206 include Group IV materials, such as silicon germanium (SiGe). In other embodiments, the plurality of first layers 204 and the plurality of second layers 206 include various III-V materials, such as indium-phosphorus (InP) and indium-gallium-phosphorus (InGaP), respectively. In some embodiments, the plurality of first layers 204 and the plurality of second layers 206 are multiple pairs of lattice matched materials. In some embodiments, the plurality of first layers 204 and corresponding plurality of second layers 206 may be any number of lattice matched material pairs suitable for forming the superlattice structure 200. For example, the plurality of first layers 204 and corresponding plurality of second layers 206 include between about 2 to about 5 pairs of lattice matched materials.

Material layer 210 and material layer 208 are included the in the plurality of second layers in one embodiment. Alternatively, material layer 208 may be considered a third material layer. Material layers 210 and 208 are formed from the same material as the plurality of second layers 206, such as silicon germanium. However, it is contemplated that the compositional profile of the material layers 210 and 208 may differ in molar ratio of Si:Ge.

In one example, the plurality of first layers 204 and the material layer 210 have a silicon:germanium molar ratio of between about 1:1 and about 5:1. In one embodiment, the silicon germanium material of the plurality of first layers 204 and the material layer 210 has a germanium content of between about 10% and about 50%, such as between about 20% and about 40%. The silicon content is between about 30% and about 90%, such as between about 50% and about 80%, for example, about 70%. Alternatively, the plurality of first layers 204 may be formed from a pure silicon material. In another example, the material layer 208 has a silicon:germanium molar ratio of between about 1:1 and about 1:5. In one embodiment, the silicon germanium material of the material layer 208 has a germanium content of between about 20% and about 100%, such as between about 50% and about 80%. The silicon content is between about 0% and about 80%, such as between about 20% and about 40%.

The plurality of first layers 204, the plurality of second layers 206, and the material layers 210, 208 are deposited using an epitaxial chemical vapor deposition process. Suitable precursors for forming the plurality of first layers 204, the plurality of second layers 206, and the material layers 210, 208 include $SiH_4$ and $GeH_4$, among others. In certain embodiments, the plurality of first layers 204 and the plurality of second layers 206 are deposited at a sufficiently low temperature, for example between about 300 degrees Celsius to about 750 degrees Celsius, to prevent intermixing of the different atomic species. As a result, interfaces between the different atomic species may be controlled which provides advantageous control of the structure during selective etching or modification processes, such as oxidation processes.

The material layers of the superlattice structure 200 may have controlled thicknesses to provide for substantially defect free crystallographic profiles of the various materials. In one embodiment, the layers of the superlattice structure 200 have a thickness of between about 3 nm and about 50 nm. For example, the plurality of first layers 204 have a thickness 220 between about 3 nm and about 10 nm, such as between about 5 nm and 7 nm, for example, about 6 nm. The plurality of second layers 206 have a thickness 218 of between about 5 nm and about 15 nm, such as between about 7 nm and about 10 nm, for example, about 8 nm. The material layer 210 has a thickness 214 of between about 5 nm and about 15 nm, such as between about 8 nm and about 12 nm, for example, about 10 nm. The material layer 208 has a thickness 216 if between about 5 nm and about 15 nm, such as between about 8 nm and about 12 nm, for example, about 10 nm.

During formation of the superlattice structure 200 on the substrate 202, the various material layers are deposited in certain sequences to manufacture one or more devices within the superlattice structure 200. In one embodiment, the material layer 210 is disposed on the substrate 202 and the material layer 208 is disposed on the material layer 210. In another embodiment, the material layer 210 may be optional, such that the material layer 208 is disposed on the substrate 202.

The plurality of second layers 206 and the plurality of first layers 204 are deposited in an alternating arrangement to form a stacked structure. In this embodiment, one of the second layers 206 is disposed on the material layer 208 and one of the first layers 204 is disposed on the one of the second layers 206. A hardmask layer 212 may also be disposed on the superlattice structure 200. In one embodiment, the hardmask layer 212 is disposed on one of the first layers 204. The hardmask layer 212 may be any suitable hardmask material, such as a silicon nitride material or the like.

Figure 3:
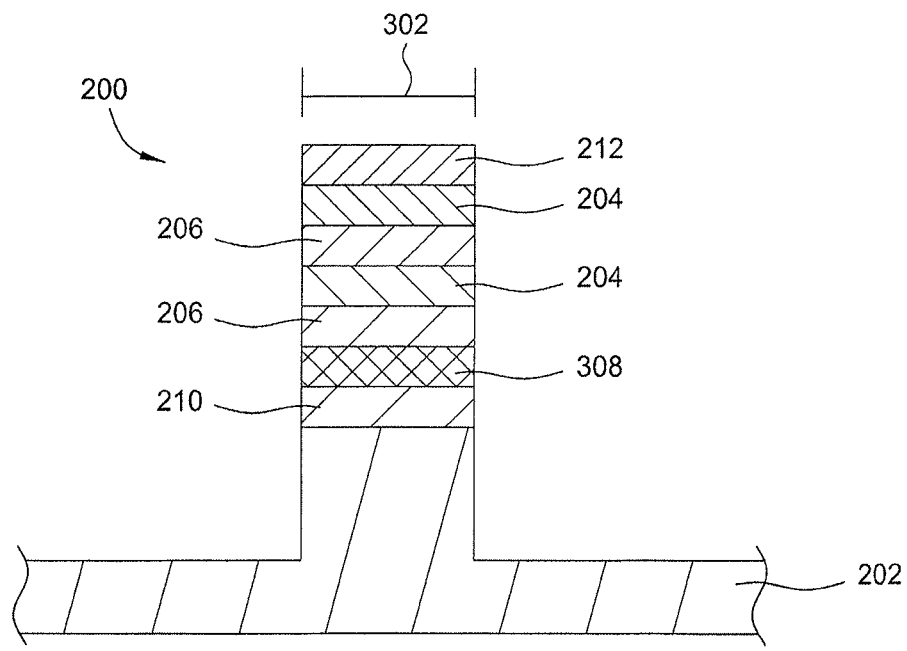
FIG. 3 illustrates a schematic, cross-sectional view of a portion of the substrate and superlattice structure of FIG. 2 after patterning, etching, and buried oxide layer formation processes are performed.

FIG. 3 illustrates a schematic, cross-sectional view of a portion of the substrate 202 and superlattice structure 200 of FIG. 2 after patterning, etching, and oxidation processes are performed. In one embodiment, photolithography processes, such as extreme ultraviolet patterning processes, is utilized to pattern the substrate 202 and the superlattice structure 200. In another embodiment, self-aligned double or quadruple patterning processes are utilized to pattern the substrate 202 and the superlattice structure 200. The patterning processes may be configured to enable formation of the superlattice structure 200 after an etching process with a channel width 302 of between about 5 nm and about 15 nm, for example, between about 7 nm and about 10 nm.

Exemplary etching processes which may be utilized to etch the substrate 202 and the superlattice structure 200 reactive ion etching (RIE) processes or the like. In one embodiment, an RIE process is performed utilizing a chlorine, bromine, or fluorine based chemistry to anisotropically etch the substrate 202 and the superlattice structure 200.

The superlattice structure 200 formed on the substrate 202 is also subjected to the high pressure oxidation process described with regard to operation 130. The high pressure oxidation process selectively oxidizes one or more of the various material layers of the superlattice structure 200. For example, the oxidation process selectively oxidizes the material layer 208. The oxidation process may be configured such that the relatively low germanium content layers, for example, the material layer 210 and the plurality of second layers 206, are not oxidized during the oxidation process while providing for oxidation of relatively high germanium content layers, such as the material layer 208. After selective oxidation, the material layer 208 is transformed into a buried oxide (BOX) layer 308. In one embodiment, oxidation of the material layer 208 to form the BOX layer 308 also includes oxidation of the material layer 210 as a result of the material layer's proximity to the material layer 208. However, in this embodiment, the plurality of second layers 206 remains substantially un-oxidized.

Figure 4:
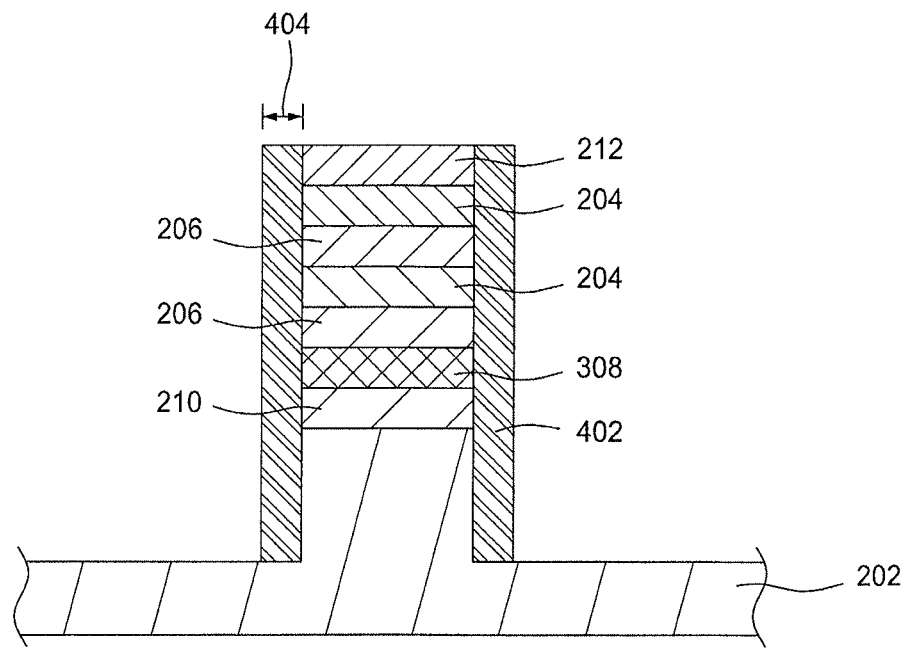
FIG. 4 illustrates a schematic, cross-sectional view of a portion of the substrate and superlattice structure of FIG. 3 after a liner formation process is performed.

FIG. 4 illustrates a schematic, cross-sectional view of a portion of the substrate 202 and superlattice structure 200 of FIG. 3 after an optional liner formation process is performed. During the previously described etching process, sidewalls of the superlattice structure 200 may be damaged. A liner deposition process is performed to deposit a liner material 402 on sidewalls of the superlattice structure 200 and at least a portion of the substrate 202.

The liner material deposition process includes several distinct operations to manufacture the liner material 402. For example, a thermal oxidation process is performed to deposit an oxide material on sidewalls of the superlattice structure 200, which includes the BOX layer 308, and the substrate 202. Subsequently, a nitridation process, such as a decoupled plasma nitridation process, is performed to incorporate nitrogen in the oxide material to form an oxynitride material. The oxynitride liner material 402 is then subjected to a post-nitridation annealing process to further incorporate the nitrogen into the oxide material. The post-nitridation annealing process may also cure defects that may exist in the liner material 402.

In one embodiment, a width 404 of the liner material 402 is between about 5 Å and about 50 Å, such as between about 20 Å and about 30 Å, for example, about 25 Å. It is contemplated that the liner material 402 may be suitable for preventing oxidation of unoxidized material layers of the superlattice structure 200 during a subsequent shallow trench isolation process.

Figure 5:
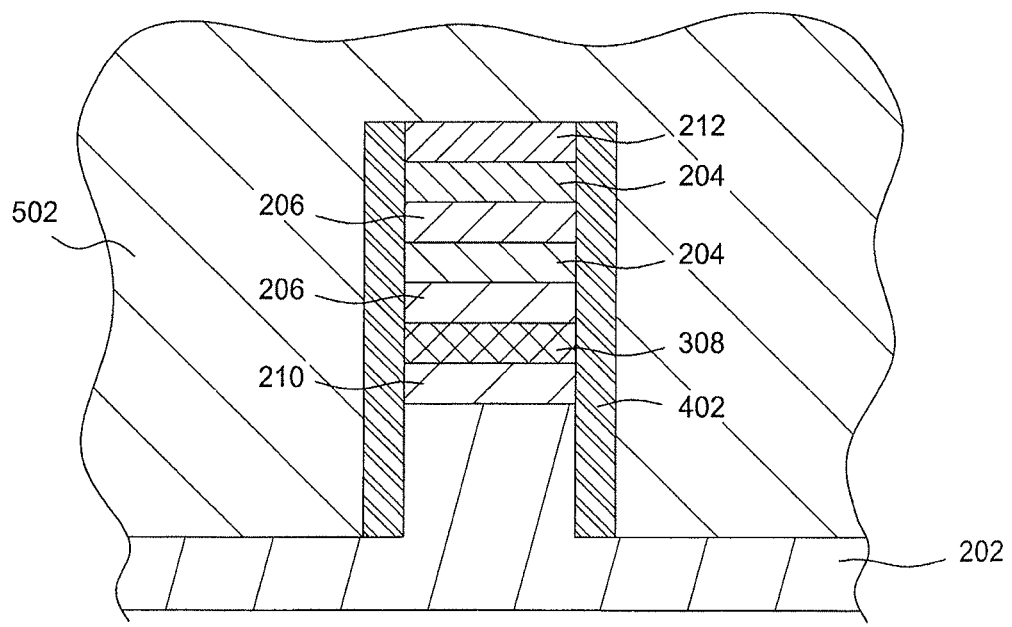
FIG. 5 illustrates a schematic, cross-sectional view of a portion of the substrate and superlattice structure of FIG. 4 after a shallow trench isolation (STI) process is performed.

FIG. 5 illustrates a schematic, cross-sectional view of a portion of the substrate 202 and superlattice structure 200 of FIG. 4 after a shallow trench isolation (STI) process is performed. The STI process is generally performed to electrically isolate at least one of the substrate 202 and/or the superlattice structure 200 from wells having different conductivity types (e.g., n-type or p-type) and/or adjacent transistor features (not shown) on the substrate 202. In one embodiment, the STI process is a flowable CVD deposition process configured to deposit a dielectric material layer 502, such as a silicon oxide material or a silicon nitride material. The dielectric material layer 502 is formed using a high-density plasma CVD system, a plasma enhanced CVD system, and/or a sub-atmospheric CVD system, among other systems. Examples of CVD systems that may be adapted to form the dielectric material layer 502 include the ULTIMA HDP CVD® system and PRODUCER® ETERNA CVD® system, both available from Applied Materials, Inc., of Santa Clara, Calif. It is contemplated that other suitably configured CVD systems from other manufacturers may also be utilized.

Figure 6:
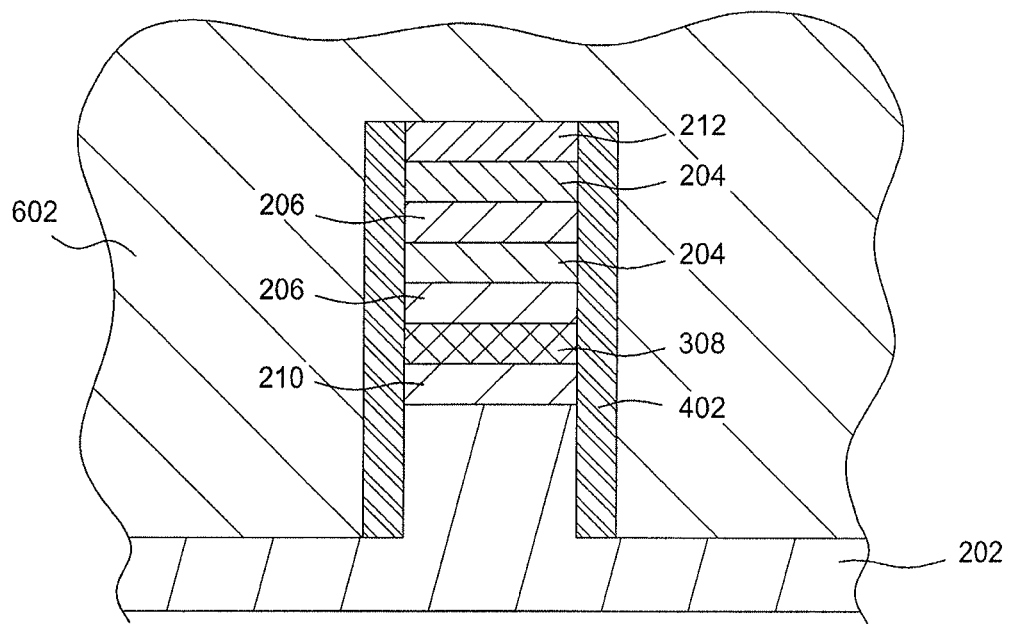
FIG. 6 illustrates a schematic, cross-sectional view of a portion of the substrate and superlattice structure of FIG. 5 after an annealing process is performed.

FIG. 6 illustrates a schematic, cross-sectional view of a portion of the substrate 202 and superlattice structure 200 of FIG. 5 after an annealing process is performed. The annealing process is performed to densify the dielectric material layer 502 to form a densified dielectric material layer 602.

In one embodiment, the annealing process includes a steam annealing process. The steam annealing process is performed at a temperature of between about 300 degrees Celsius and about 800 degrees Celsius, such as between about 500 degrees Celsius and about 600 degrees Celsius. The steam annealing process is performed for an amount of time between about 15 minutes and about 180 minutes, for example, about 120 minutes. The steam annealing process may also further oxidize the densified dielectric material layer 602.

In another embodiment, the annealing process also includes a dry annealing process. The dry annealing process is performed at a temperature of between about 500 degrees Celsius and about 1000 degrees Celsius, such as between about 650 degrees Celsius and about 750 degrees Celsius. The dry annealing process is performed for an amount of time between about 1 minute and about 60 minutes, for example, about 30 minutes. In yet another embodiment, both the steam annealing process and the dry annealing process are utilized together. In this embodiment, the dry annealing process is performed after the steam annealing process.

In another embodiment, if the BOX layer 308 has not been previously formed, the high pressure oxidation process is utilized to replace the annealing process. In this embodiment, the liner formed in operation 140 and described in detail with regard to FIG. 4 is not utilized. Thus, the superlattice structure 200 is exposed and the high pressure oxidation process may be utilized to oxidize one or more layers to form the BOX layer 308.

After the one or more annealing processes are performed, the substrate 202 is planarized. More specifically, the densified dielectric material layer 602 may be polished, etched, or otherwise modified such that a top surface of the densified dielectric material layer 602 is substantially co-planar with the hardmask layer 212. In one embodiment, the hardmask layer 212 is utilized as a stop indicator for a chemical mechanical polishing process. In one embodiment, the hardmask layer 212 is removed from the superlattice structure 200 after planarization of the densified dielectric material layer 602.

Figure 7:
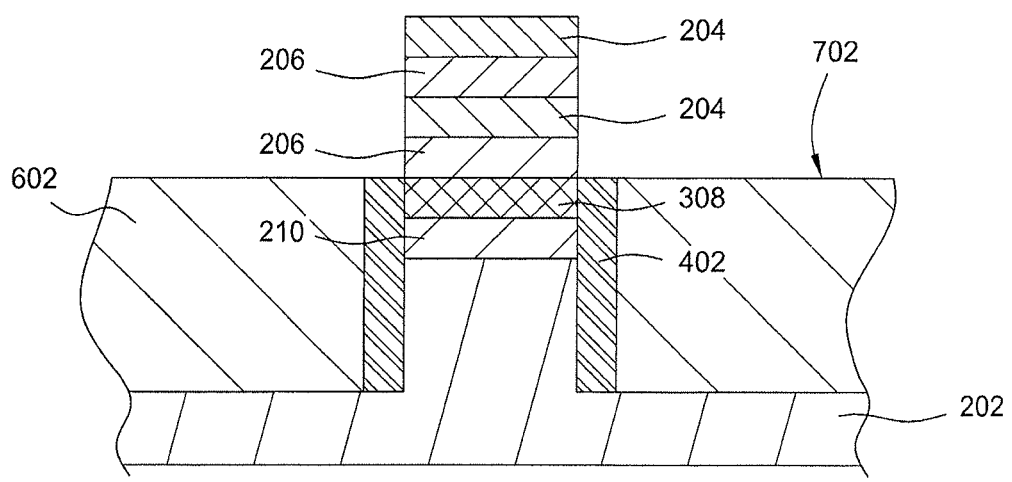
FIG. 7 illustrates a schematic, cross-sectional view of a portion of the substrate and superlattice structure of FIG. 6 after an STI recess process is performed.

FIG. 7 illustrates a schematic, cross-sectional view of a portion of the substrate 202 and superlattice structure 200 of FIG. 6 after an STI recess process is performed. The STI recess process is generally an etching process configured to remove at least a portion of the densified dielectric material layer 602. In one embodiment, a top surface 702 of the densified dielectric material layer 602 is removed such that the top surface 702 is substantially co-planar with the BOX layer 308 or with an interface between the BOX layer 308 at one of the plurality of second layers 206.

The STI recess process also removes a portion of the liner material 402. In one embodiment, the STI recess process is a remote plasma assisted dry etching process which exposes various materials disposed on the substrate 202 to $H_2$, $NF_3$, and $NH_3$ plasma by-products. The STI recess process is generally a conformal removal process and is selective to silicon oxide materials but does not readily etch silicon. For example, the removal rate of the BOX layer 308 may be less than the removal rate of the densified dielectric material layer 602.

The existence of the liner material 402 may further reduce or prevent etching of the BOX layer 308 during the STI recess process. Accordingly, over etching or undercutting of the BOX layer 308 may be reduced or eliminated during etching of the densified dielectric material layer 602. In one embodiment, the STI recess process is performed by a selective oxide etching process. One example of a suitable selective oxide etching process is the SICONI® process and suitably configured apparatus, available from Applied Materials, Inc., Santa Clara, Calif. It is contemplated that other suitable etching processes and apparatus may also be utilized to perform the STI recess process.

After performing the STI recess process, subsequent hGAA or FinFET processing operations may be performed. Advantageously, the BOX layer 308 is self-aligned to a bottom region of the superlattice structure 200. The self-aligned BOX formation process described herein advantageously improves transistor device performance and reduces transistor device variability by reducing or eliminating parasitic capacitance and leakage. In addition, processing flexibility and efficiency of BOX layer formation may be realized by forming the BOX layer 308 prior to depositing the dielectric material layer 502 or by forming the BOX layer 308 after deposition of the dielectric material layer 502.

Figure 8:
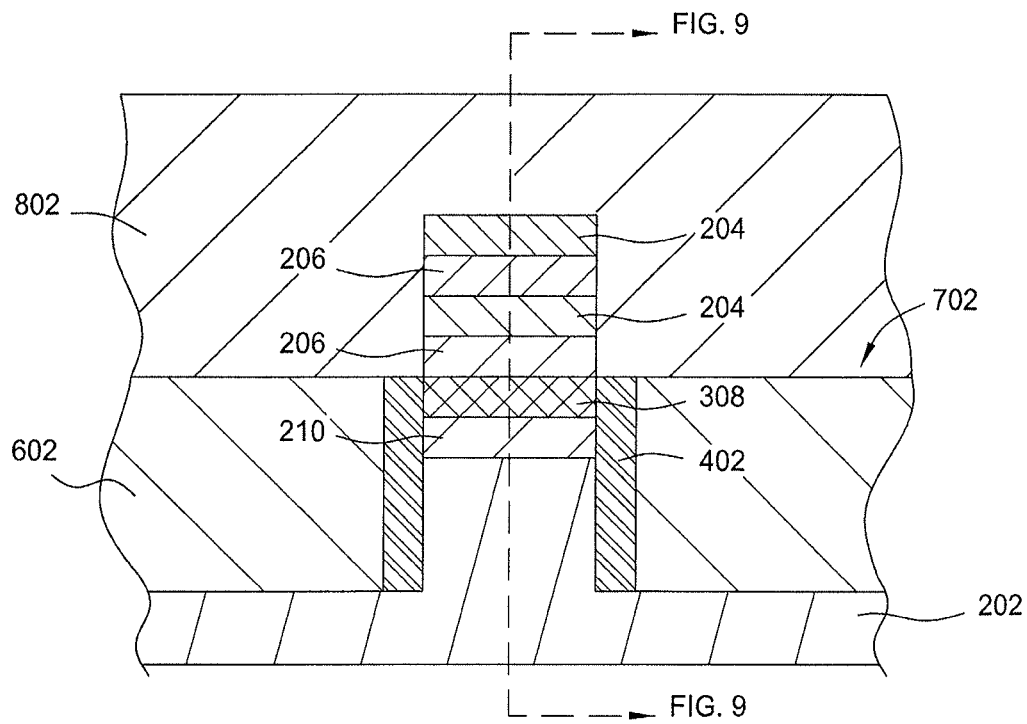
FIG. 8 illustrates a schematic, cross-sectional view of a portion of the substrate and superlattice structure of FIG. 7 after formation of a dummy gate structure.

Subsequent processing operations for forming hGAA and FinFET device structures generally include gate structure formation and source/drain formation. FIG. 8 illustrates a schematic, cross-sectional view of the substrate 202 and superlattice structure 200 with a dummy gate structure 802 formed thereon. The dummy gate structure 802 is formed from one or more materials suitable for utilization as a placeholder for subsequent replacement metal gate formation. In one embodiment, the dummy gate structure 802 is formed from a silicon containing material, such as amorphous silicon or the like.

Figure 9:
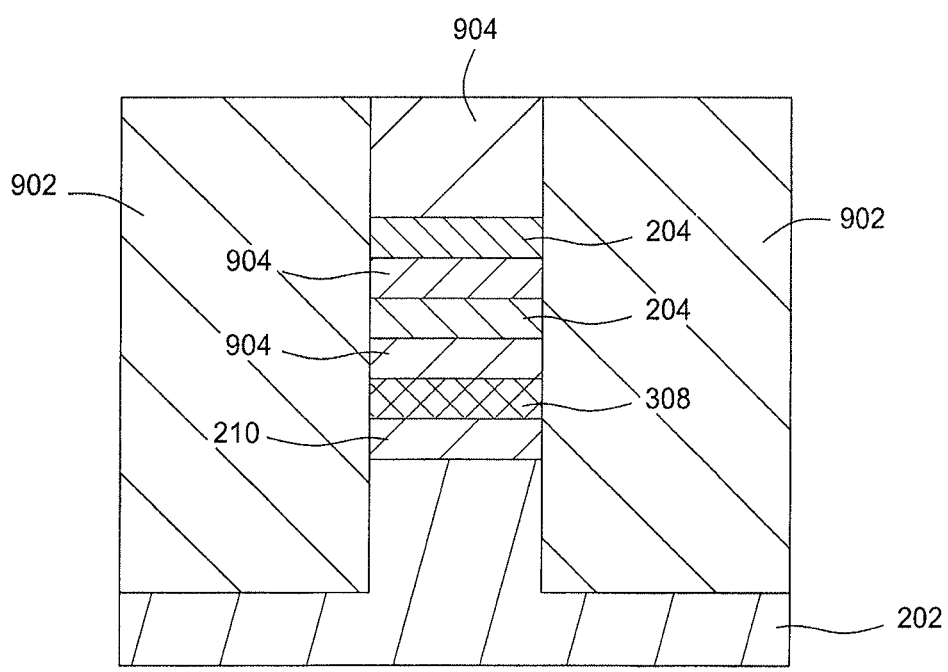
FIG. 9 illustrates a schematic, cross-sectional view of FIG. 8 rotated 90° depicting source and drain regions formed on the substrate adjacent the superlattice structure.

FIG. 9 illustrates a schematic, cross-sectional view of FIG. 8 rotated 90° along section line 9-9 depicting source/drain regions 902 formed on the substrate 202 adjacent the superlattice structure 200. The source/drain regions 902 are generally deposited on the substrate 202 such that the source/drain regions 902 couple with the superlattice structure 200 (which may function as a channel) and facilitate the flow of electrons and holes therebetween.

The source/drain regions 902 are formed from suitable materials, such as silicon containing materials, doped silicon materials, compound silicon materials, or non-silicon containing materials. For example, the source/drain regions 902 may be silicon, phosphorous doped silicon, silicon germanium materials, or germanium. It is contemplated that the type of source/drain region material is selected in response to desired n-type or p-type characteristics of the source/drain regions 902. The source/drain regions 902 are deposited by suitable deposition techniques, such as CVD techniques or epitaxial deposition techniques.

In one embodiment, such as hGAA integration schemes, the plurality of second layers 206 and the dummy gate structure 802 are replaced by a metal gate structure 904. The plurality of second layers 206 and the dummy gate structure 802, which exhibit sufficiently different compositional profiles to other layers of the superlattice structure 200, are removed by selective etching processes. In certain embodiments, the dummy gate structure 802 is removed by a first etching process selective to the material of the dummy gate structure 802 and the plurality of second layers 206 are removed by a second etching process selective to the material of the second layers 206. Alternatively, the dummy gate structure 802 and the plurality of second layers 206 are removed by a single etching process. Although not illustrated, in certain embodiments, a spacer material is disposed between the source/drain regions 902 and the metal gate structure 904. In this embodiment, deposition of the spacer material is performed prior to deposition of the source/drain regions 902.

In one embodiment, the high pressure oxidation process is performed after removal of the dummy gate structure 802. In this embodiment, the high pressure oxidation process described with regard to operation 130 is performed prior to formation of the replacement metal gate structure 904. In these embodiments, the material layer 208 remains substantially unoxidized until the dummy gate structure is formed and subsequently removed to expose the material layer 208 which is oxidized by the high pressure oxidation process to form the BOX layer 308. Accordingly, process flexibility in forming the BOX layer 308 is improved which may provide for more efficient BOX layer formation and improved device performance, depending on the desired integration scheme. It is contemplated that hGAA and FinFET processing sequences, among others, can derive benefits from implementing the above described BOX layer formation schemes (i.e. BOX layer 308 formed before deposition of dielectric material layer 502 or BOX layer 308 formed after deposition of dielectric material layer 502).

Subsequently, the metal gate structure 904 is deposited in regions previously occupied by the dummy gate structure 802 and the plurality of second layers 206. Generally, the metal gate structure 904 may be deposited by suitably configured epitaxial processes, atomic layer deposition (ALD) processes, or CVD processes. Materials utilized for the metal gate structure 904 generally exhibit a k-value of greater than about 3.9. Examples of materials with suitably high k values include hafnium dioxide, zirconium dioxide, titanium dioxide, titanium nitride, and titanium aluminide, among others. Various other nitride materials are utilized in certain embodiments. In one embodiment, the materials described above are utilized for portions of the metal gate structure 904 which replace the plurality of second layers 206.

A portion of the metal gate structure 904 which replaces the dummy gate structure 802 is formed from a metal containing material and/or a conductive material. For example, suitable materials include titanium containing materials, such as TiN or TiAlC, and tantalum containing materials, such as TaN. Other suitable materials include refractory metals, such as tungsten, ruthenium, rhenium, and the like. In certain embodiments, materials utilized to form regions of the metal gate structure 904 which replace the plurality of second layers 206 and the dummy gate structure 802 are the same materials or different materials as described above. The types of materials selected for the metal gate structure 904 may be determined by the transistor type (i.e. NMOS/PMOS).

Figure 10:
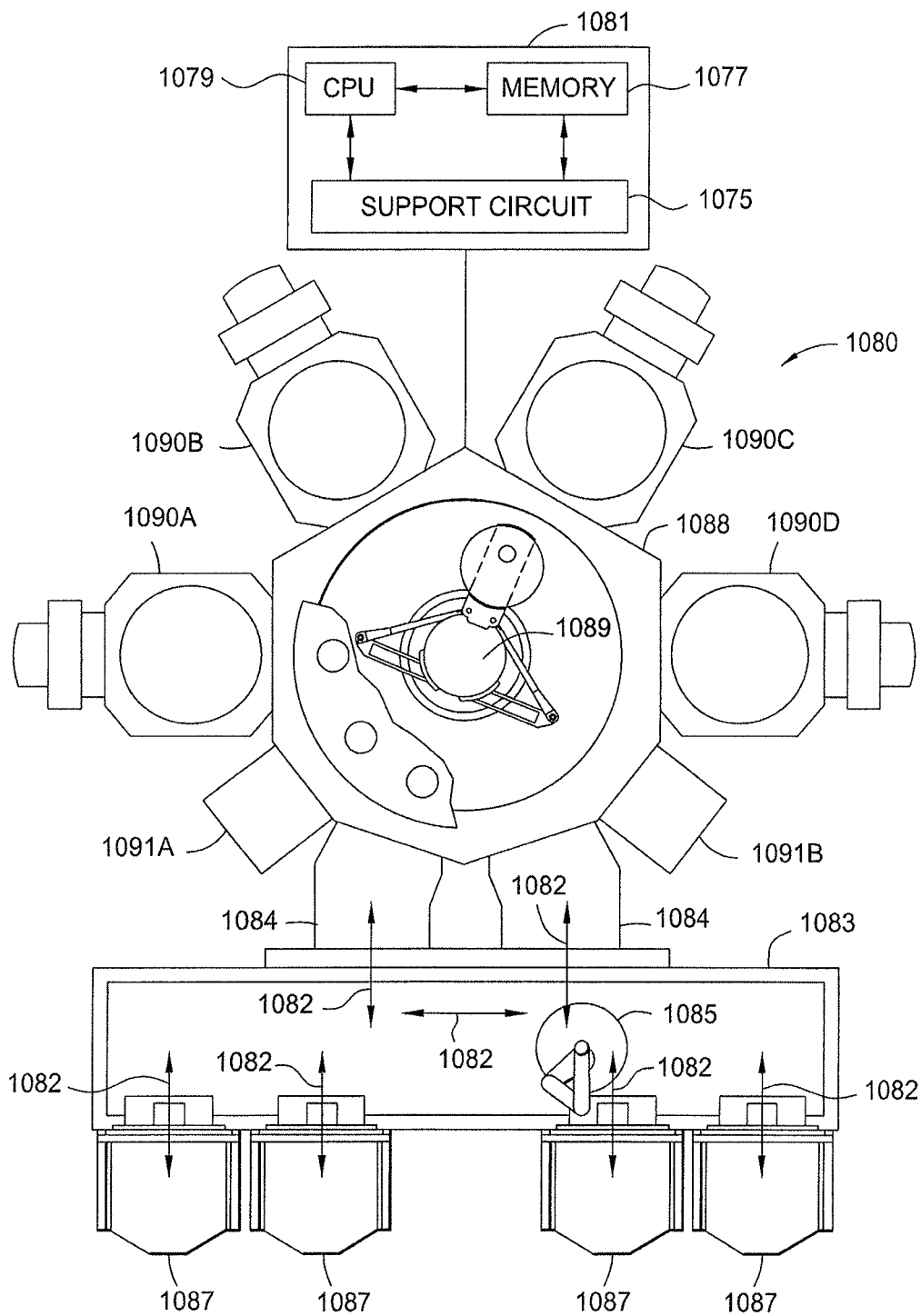
FIG. 10 illustrates a cluster tool which may be utilized in accordance with one or more of the embodiments described herein.

FIG. 10 illustrates a schematic, plan view of a cluster tool 1080 suitable for performing one or more portions of the present disclosure. Generally, the cluster tool 1080 is a modular system comprising multiple chambers (e.g., process chambers 1090A-D, service chambers 1091A-B, or the like) which perform various functions, including: substrate center-finding and orientation, degassing, annealing, deposition and/or etching.

The cluster tool 1080 includes at least a semiconductor substrate process chamber configured to perform at least portions of the method 100 and may further include chambers such as ion implantation chambers, etch chambers, deposition chambers, high pressure oxidation chambers and the like. The multiple chambers of the cluster tool 1080 are mounted to a central vacuum transfer chamber 1088 which houses a robot 1089 adapted to shuttle substrates between the chambers. The vacuum transfer chamber 1088 is typically maintained at a vacuum condition and provides an intermediate stage for shuttling substrates from one chamber to another and/or to a load lock chamber 1084 positioned at a front end of the cluster tool 1080.

A front-end environment 1083 is shown positioned in selective communication with the load lock chambers 1084. A pod loader 1085 disposed in the front-end environment 1083 is capable of linear and rotational movement (arrows 1082) to shuttle cassettes of substrates between the load lock chambers 1084 and a plurality of pods 1087 which are mounted on the front-end environment 1083.

The cluster tool 1080 also includes a controller 1081 programmed to carry out the various processing methods performed in the cluster tool 1080. For example, the controller 1081 is configured to control flow of various precursor and process gases from gas sources and control processing parameters associated with material deposition, etching, and oxidation processes. The controller 1081 includes a programmable central processing unit (CPU) 1079 that is operable with a memory 1077 and a mass storage device, an input control unit, and a display unit (not shown), such as power supplies, clocks, cache, input/output (I/O) circuits, and the like, coupled to the various components of the cluster tool 1080 to facilitate control of the substrate processing. The controller 1081 also includes hardware for monitoring substrate processing through sensors in the cluster tool 1080. Other sensors that measure system parameters such as substrate temperature, chamber atmosphere pressure and the like, may also provide information to the controller 1081.

To facilitate control of the cluster tool 1080 described above, the CPU 1079 may be one of any form of general purpose computer processor that can be used in an industrial setting, such as a programmable logic controller (PLC), for controlling various chambers and sub-processors. The memory 1077 is coupled to the CPU 1079 and the memory 1077 is non-transitory and may be one or more of readily available memory such as random access memory (RAM), read only memory (ROM), floppy disk drive, hard disk, or any other form of digital storage, local or remote. Support circuits 1075 are coupled to the CPU 1079 for supporting the processor in a conventional manner. Deposition, etching, oxidation, and other processes are generally stored in the memory 1077, typically as a software routine. The software routine may also be stored and/or executed by a second CPU (not shown) that is remotely located from the hardware being controlled by the CPU 1079.

The memory 1077 is in the form of computer-readable storage media that contains instructions, that when executed by the CPU 1079, facilitates the operation of the cluster tool 1080. The instructions in the memory 1077 are in the form of a program product such as a program that implements the method of the present disclosure. The program code may conform to any one of a number of different programming languages. In one example, the disclosure is implemented as a program product stored on computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

For the purposes of practicing embodiments of the present disclosure, at least one of the processing chambers (for example, 1090A) of the cluster tool 1080 is configured to perform an etch process, a second processing chamber (for example 1090B) is configured to perform a cleaning process and a third processing chamber (for example 1090C) is configured to perform a epitaxial deposition process, and a fourth processing chamber (for example 1090D) is configured to perform a high pressure oxidation process. A cluster tool having the recited configuration may advantageously prevent unwanted oxidation after the source/drain recess is etched and reduces or eliminates subsequent cleaning of oxidized surfaces prior to epitaxial deposition. A cluster tool having the disclosed configuration may advantageously prevent oxidation of the channel structure upon exposure of the hGAA or FinFET channel.

In summation, embodiments described herein provide for improved selective oxidation processes. More specifically, utilizing a high pressure steam anneal, which may be a wet steam, a dry steam, or a superheated steam annealing process, provides for sufficient material selectivity with improved throughput for FinFET and hGAA integration processes. Moreover, the high pressure steam anneal process may be utilized at various stages of a FinFET or hGAA fabrication process, thus improving process flexibility.

While the foregoing is directed to embodiments of the present disclosure, other and further embodiments of the disclosure may be devised without departing from the basic scope thereof, and the scope thereof is determined by the claims that follow.

What is claimed is:

1. A semiconductor process method, comprising:
   forming a superlattice structure on a substrate, wherein the superlattice structure comprises:
      a first material layer;
      a second material layer; and
      a third material layer;
   patterning the superlattice structure;
   etching the superlattice structure; and
   performing an oxidation process to oxidize at least one of the first material layer, the second material layer, or the third material layer to form a buried oxide layer, wherein the oxidation process is performed at a pressure of greater than 30 bar.

2. The method of claim 1, wherein the oxidation process is performed at a temperature of between 300° C. and 400° C.

3. The method of claim 1, wherein a duration of the oxidation process is between 10 minutes and 20 minutes.

4. The method of claim 1, wherein the first material layer and the second material layer are disposed within the superlattice structure in an alternating stacked arrangement.

5. The method of claim 4, wherein the second material layer comprises 70% silicon and 30% germanium, and the third material layer comprises 30% silicon and 70% germanium.

6. The method of claim 5, wherein the second material layer is disposed on the substrate and the third material layer is disposed on the second material layer.

7. The method of claim 1, wherein the substrate and the first material layer comprise a silicon containing material.

8. The method of claim 1, further comprising:
   performing a liner deposition process to form a liner comprising an oxynitride material on the superlattice structure.

9. The method of claim 8, wherein the liner deposition process further comprises:
   a thermal oxidation process;
   a nitridation process; and
   an annealing process.

10. The method of claim 1, further comprising:
    performing a shallow trench isolation process comprising a flowable chemical vapor deposition process to deposit an oxide material layer on the substrate.

11. The method of claim 10, further comprising:
    forming a dummy gate structure on the substrate;
    forming source/drain regions of the substrate; and
    removing the dummy gate structure and forming a replacement metal gate structure on the substrate.

12. A semiconductor process method, comprising:
    forming a superlattice structure on a substrate, wherein the superlattice structure comprises:
       a first material layer;
       a second material layer; and
       a third material layer;
    patterning the superlattice structure;
    etching the superlattice structure;
    performing a shallow trench isolation process to deposit an oxide material layer on the substrate;
    performing a shallow trench isolation recess process; and
    performing an oxidation process after the shallow trench isolation recess process to oxidize at least one of the first material layer, the second material layer, or the third material layer to form a buried oxide layer, wherein the oxidation process is performed at a pressure of greater than 30 bar.

13. The method of claim 12, wherein the oxidation process is performed at a temperature of between 300° C. and 400° C.

14. The method of claim 12, wherein a duration of the oxidation process is between 10 minutes and 20 minutes.

15. The method of claim 12, wherein the first material layer and the second material layer are disposed within the superlattice structure in an alternating stacked arrangement.

16. The method of claim 15, wherein the second material layer comprises 70% silicon and 30% germanium, and the third material layer comprises 30% silicon and 70% germanium.

17. The method of claim 12, further comprising:
    forming a dummy gate structure on the substrate;
    forming source/drain regions of the substrate; and
    removing the dummy gate structure and forming a replacement metal gate structure on the substrate.

18. A semiconductor process method, comprising:
    forming a superlattice structure on a substrate, wherein the superlattice structure comprises:
       a first material layer;
       a second material layer; and
       a third material layer;
    forming a dummy gate structure on the substrate;
    forming source/drain regions on the substrate;
    removing the dummy gate structure;
    performing an oxidation process after removing the dummy gate structure to oxidize at least one of the first material layer, the second material layer, or the third material layer to form a buried oxide layer, wherein the oxidation process is performed at a pressure of greater than 30 bar; and
    forming a replacement metal gate structure on the substrate.

19. The method of claim 18, wherein the oxidation process is performed at a temperature of between 300° C. and 400° C.

20. The method of claim 18, wherein a duration of the oxidation process is between 10 minutes and 20 minutes.

* * * * *